United States Patent [19]

Yorkanis et al.

[11] 4,422,052
[45] Dec. 20, 1983

[54] DELAY CIRCUIT EMPLOYING ACTIVE BANDPASS FILTER

[75] Inventors: Bernard J. Yorkanis, South Plainfield; Walter E. Sepp, Princeton, both of N.J.

[73] Assignee: RCA Corporation, New York, N.Y.

[21] Appl. No.: 268,374

[22] Filed: May 29, 1981

[51] Int. Cl.³ .............................................. H23F 3/68
[52] U.S. Cl. .................................. 330/295; 330/126; 330/294; 307/590
[58] Field of Search ............... 330/107, 109, 126, 294, 330/295, 304; 307/529, 590, 595; 358/39, 40; 333/28 R

[56] References Cited

U.S. PATENT DOCUMENTS 3,796,967  3/1974  Sondermeyer ................. 330/293 X
3,818,359  6/1974  Hekimian ...................... 333/28 R X

OTHER PUBLICATIONS

"A Voltage-Tuned Active Filter", *Electronic Engineering*, Feb. 1972, p. 45.
Johnson and Hilburn, "Rapid Practical Designs of Active Filters", John Wiley & Sons, 1975, Chapter 6, pp. 225, 231.
Lindquist, "Active Network Design with Signal Filtering Applications", Steward & Sons, 1977, pp. 616–617.
Lancaster, "Active Filter Cookbook", Howard W. Sams & Co., Inc., 1975, pp. 154–155.

*Primary Examiner*—James B. Mullins
*Attorney, Agent, or Firm*—E. M. Whitacre; J. S. Tripoli; R. G. Coalter

[57] ABSTRACT

A signal to be delayed is applied to a frequency selective path including an inverting active bandpass filter and to a non-frequency selective path including a voltage-to-current converter. The paths are coupled to a signal combiner which produces an output current having a first component proportional to the output current of the converter and a second component directly proportional to the filter output voltage and inversely proportional to the value of a gain control resistor. The resistor is selected to provide a predetermined ratio of the output current components to provide an overall allpass characteristic for the delay circuit and biased to conduct no current under quiescent signal conditions thereby reducing power dissipation. Several circuits may be cascaded for such purposes as peaking and delay equalization in television receivers, video disc players or the like.

7 Claims, 3 Drawing Figures

DELAY CIRCUIT EMPLOYING ACTIVE BANDPASS FILTER

This invention relates to electrical circuits and particularly to circuits for delaying electrical signals.

Delay circuits are useful in a variety of applications in the signal processing field. In a television receiver or a video disc player, for example, delay circuits may be used to compensate for time delay differences in the luminance and chrominance signal paths so as to maintain proper registration of the displayed picture. Such apparatus also may employ delay circuits in transversal filters for providing such functions as luminance-chrominance signal separation, peaking and the like. In such applications, phase linearity is highly desirable. Examples of passive networks having this characteristic include Thompson filters, Gaussian networks and distributed parameter LC (inductance-capacitance) delay lines. Such circuits, however, are relatively bulky, expensive and are not readily adaptable for fabrication in integrated circuit form because of the need for inductance in the circuit.

Active delay circuits which do not require inductive elements and which may be fabricated in integrated circuit form are also known. Such circuits may be considered as being either of the clocked or the unclocked type. Examples of clocked active delay circuits include digital shift registers and analog shift registers (e.g., CCD or bucket brigade delay lines). One disadvantage of the clocked delay circuit is that substantial power may be dissipated in the clock driver circuitry. Another is that clock signal radiation may cause undesirable interference with other circuits thus requiring shielding, low pass filtering of the output signal, power supply decoupling or other interference suppression devices.

Unclocked active delay circuits which do not require the use of inductors and which are not subject to the problems of clock driver dissipation and clock signal interference are known. See, for example, chapter six of the textbook "Rapid Practical Designs of Active Filters" by Johnson and Hilburn published by John Wiley & Sons in 1975. In one of the circuits of Johnson and Hilburn, a second order allpass filter characteristic (constant delay) is achieved in a design requiring only one operational amplifier as the active (amplifying) element but the circuit gain is restricted to values less than unity. Another of the Johnson and Hilburn circuits overcomes the signal loss problem and features improved stability but requires the use of four operational amplifiers and thus is relatively complex and power consuming.

Another form of active delay circuit is described in the textbook "Active Network Design With Signal Filtering Applications" by C. S. Lindquist published by Steward & Sons in 1977. At page 617 of the text, there is shown an allpass network including a second order inverting active bandpass filter of the Sallen-Key type and a resistive network for combining the filter input and output signals to provide a delayed output signal. It is known that second order Sallen-Key filters have the advantage of using very small valued capacitors (see, for example, the handbook "Active Filter Cookbook" by D. Lancaster, published in 1975 by Howard W. Sams & Co., Inc.). From this, the allpass network shown in the Lindquist textbook might appear potentially useful for fabrication in integrated circuit form. One problem, however, is that resistive signal summing is an inherently lossy process and thus tends to place practical limits on the number of delay circuits which may be connected in cascade. Another problem is that the overall circuit gain is sensitive to loading of the signal summing node.

A need exists for a delay circuit which does not require the use of inductors or clock signal sources, which is relatively stable and insensitive to circuit loading effects and in which power dissipation is relatively low. The present invention is directed to meeting that need.

A delay circuit in accordance with the invention includes an input node for receiving an input signal to be delayed. The node is coupled to the input of an active bandpass filter means for providing a bandpass filtered and inverted output signal voltage and to the input of a voltage-to-current converter means for providing an output signal current proportional to the amplitude of the input signal and independent of the frequency thereof. The signal voltage and the signal current are applied to respective inputs of an active signal combining means which provides a composite output current having a first component substantially equal to the signal current produced by the converter means and a second component directly proportional to the signal voltage and inversely proportional to the value of a gain control resistor in the combining means. The gain control resistor is of a predetermined value for controlling the ratio of the first and second components of the output current of the combining means and is biased to conduct substantially no current under quiescent signal conditions.

The invention is illustrated in the accompanying drawings wherein like elements are denoted by like designators and in which.

Figure 1:
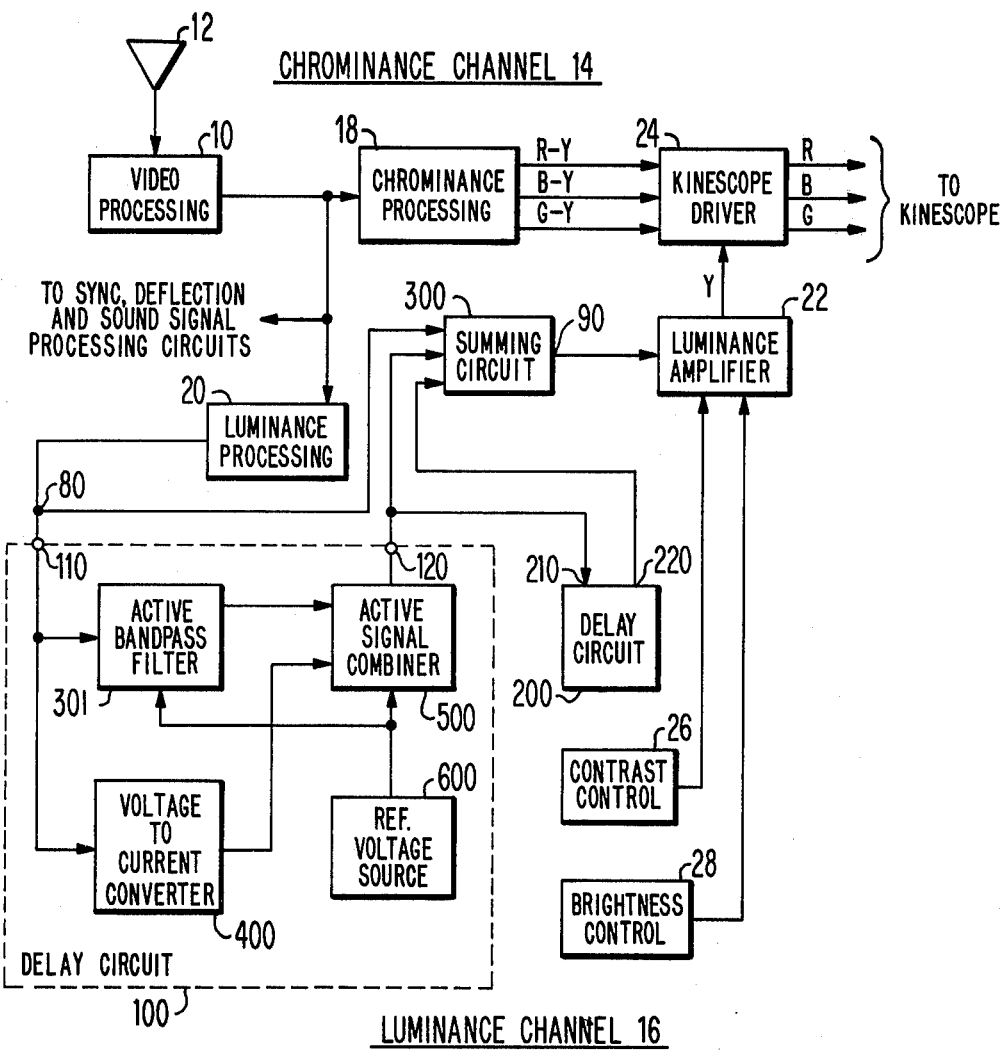
FIG. 1 is a block diagram of a television receiver having a delay circuit embodying the invention.

In FIG. 1 the delay circuit 100 embodying the invention is utilized in combination with a second identical delay circuit 200 and a summing circuit 300 to form a transversal peaking filter in the luminance signal processing channel 16 of a television receiver to improve the sharpness of reproduced images. In practice, a number of delay circuits may be cascaded to provide a desired value of delay. Here only two delay circuits are used to provide peaking. It will be appreciated that the delay circuit 100 is of general utility and may be used for equalizing delay difference between luminance and chrominance channels, luminance/chrominance signal separation and other purposes in television receivers or video disc players or in any application where signal delay is needed (e.g., radar, sonar and the like). A particular advantage of the delay circuit in video signal processing applications is that in many cases relatively short delay times (e.g., a few tens or hundreds of nanoseconds) are needed and when the circuit is implemented with the preferred form of filter (a modified second order Sallen-Key active bandpass filter), the filter capacitance values for video bandwidth signals are very small (e.g., a few pico-Farads). Thus, the delay circuit may readily be fabricated as an integrated circuit thereby improving reliability and reducing cost.

The receiver comprises a video signal processing unit 10 responsive to radio frequency (RF) television signals received by an antenna 12 for generating (by means of suitable tuner circuits, intermediate frequency circuits and deflection circuits, not shown) a composite video signal comprising chrominance, luminance, sound and synchronizing signals. The output of video signal processing unit 10 is coupled to a chrominance channel 14, to a luminance channel 16, and to sync, deflection and sound signal processing units (not shown).

Chrominance channel 14 includes a chrominance processing unit 18 which includes a filter for separating the chrominance signal component from the composite video signal and circuitry for deriving the R-Y, B-Y, and G-Y color difference signals from the chrominance signal component.

A luminance signal processing unit 20 of the luminance channel 16 serves to attenuate undesirable signals present in the luminance channel 16 such as chrominance or sound signals and includes a delay line for equalizing delay differences between the chrominance and luminance channels thereby maintaining proper registration of reproduced images. Delay difference exist principally because of signal bandwidth differences in the two channels with the chrominance channel having the narrower bandwidth (e.g., 1 MHz or so) as compared with that of the luminance channel (e.g., 3-4 MHz or so). The delay line (not shown) in luminance processor 20 may be a conventional distributed parameter LC delay line, a cascade connection of delay circuits such as circuit 100 or some other suitable delay means.

The output of luminance signal processing unit 20 is coupled to a circuit node 80 which forms the input of a transversal peaking filter comprising delay circuits 100 and 200 and a summing circuit 300. The transversal filter comprises a cascade connection of identical delay circuits 100 and 200 having an input terminal 110, a common tap point 120-210 and an output terminal 220 connected to respective inputs of a three input summing circuit 300.

Summing circuit 300 combines the signals supplied thereto in a manner to accentuate luminance signal transitions and thus improve the sharpness of reproduced images. The summing circuit may be of the general kind proposed by Gibson in U.S. Pat. No. 4,074,308 and may include a peaking control circuit (not shown) for varying the amount of luminance signal peaking of the transversal filter 100, 200, 300. Since the summing circuit described by Gibson is used with a conventional tapped delay line rather than inverting delay circuits as shown here, the polarities of the summing elements in circuit 300 should be appropriately modified to conform to this difference. Advantageously, both of the delay circuits and the summing circuit may be fabricated in integrated circuit form thereby improving reliability and eliminating the need for an external tapped delay line as shown in the Gibson patent.

The output of transversal filter 100, 200, 300 is coupled to a luminance amplifier 22 which serves to amplify and otherwise process the processed luminance signal to produce an output signal Y. The Y output signal and the R-Y, G-Y, and B-Y color difference output signals of chrominance channel 14 are coupled to a kinescope driver 24 where they are matrixed to form R, G, and B color signals. The R, G, and B color signals drive a kinescope (not shown). Alternatively, the luminance and color difference signals may be matrixed in the kinescope as is known.

A contrast control unit 26 is coupled to luminance amplifier 22 to control the amplitude of the luminance signal and thereby control the contrast of reproduced images. Contrast control unit 26 may also be coupled to chrominance processing unit 18 to control the amplitude of the chrominance signals and thereby control the color saturation level of reproduced images. A brightness control unit 28 is also coupled to luminance amplifier 22 to control the D.C. content of the luminance signals and thereby control the brightness of the reproduced images.

Operation of the transversal filter 100, 200, 300 of the receiver for various values of time delay (using a conventional delay line) is described in detail in the aforementioned Gibson patent (incorporated herein by reference) and so will not be repeated here. Of interest, as to the present invention, is the operation of the delay circuits 100 and 200, the design of which facilitates construction of the transversal filter in integrated circuit form. These circuits are structurally similar (although their relative delay times may differ by selection of filter component values) and so only delay circuit 100 (outlined in phantom) need be considered in detail.

In delay circuit 100 input terminal 110 is coupled to the input terminals of an active bandpass filter 301 and a voltage-to-current converter 400 which have output terminals coupled to respective voltage input and current input terminals of an active signal combiner 500. Filter 301 and combiner 500 each receive a common reference or bias voltage provided by a reference voltage source 600.

Active bandpass filter 301 is preferably of the second order Sallen-Key type having equal valued input and feedback capacitors. As previously mentioned, the capacitance values for implementing such filters are relatively small (e.g., 5 pF for video signal delay applications) and may be formed within an integrated circuit (MOS rather than junction capacitors being preferred for improved stability). Design equations for constructing such filters are known (see generally, "A Practical Method of Designing RC Active Filters" by R. P. Sallen and E. L. Key published in "IRE Transactions on Circuit Theory", Volume Ct-2, No. 1, March, 1955 page 74 et seq. See also the aforementioned Lindquist Textbook, Chapter 12-4 "All Pass Filter Design Examples" page 616, et seq. In the design of the bandpass filter, the selection of a damping factor of 1.732 ($\sqrt{3}$) will provide a maximally flat (in the Butterworth sense) envelope delay response. In this case, the useable video bandwidth is on the order of 0.4 times the resonator frequency. If some passband delay ripple is allowable, a considerably improved delay bandwidth product can be obtained. With a damping factor of 1.5695, the useable video bandwidth rises to 0.73 times the resonator frequency. In this case, the delay ripple is within ±3% up to the video bandwidth limitation.

The voltage gain of the filter is not critical since it is the ratio of the gains in the frequency selective path including filter 301 and the non-frequency selective path including voltage-to-current converter 400 which controls the allpass characteristic. This gain ratio is preferably 2:1 and is controlled by selection of a gain control resistor in signal combiner 500 as will be explained subsequently.

Reference voltage source 600 may comprise any suitable source of voltage (ground, for example). In single supply voltage applications, however, it is preferred that the reference voltage be non-zero and sufficiently larger than any saturation voltage characteristic of the voltage-to-current converter circuit which might otherwise tend to limit the linearity range of the converter. Another purpose of reference voltage source 600 is to assure that the D.C. component of the output signal produced by active bandpass filter 301 "tracks" the bias voltage applied to a gain controlling resistor in active signal combiner 500 and is of such a magnitude that substantially zero potential is produced across the gain controlling resistor under quiescent input signal conditions. In this way there is essentially zero quiescent power dissipation in the gain control resistor and its value may be set to achieve the desired 2:1 ratio of signals in the frequency selective and non-frequency selective signal paths as previously mentioned.

Voltage-to-current converter 400 may be of conventional design (see, generally, Chapter 3.2 of "Controlled Current Sources" of the textbook "Applications of Operational Amplifiers, Third Generation Techniques", by J. G. Graeme, published by McGraw-Hill Book Company in 1973) but preferably comprises a current mirror amplifier having an input current limiting resistor. The function of converter 400 is to produce an output current proportional to the luminance input signal voltage and to supply the output current to the current input terminal of combiner 500. A voltage-to-current converter is used for this purpose so that the magnitude of the current is rendered substantially independent of whatever potential may be present at the current input terminal of combiner 500. A resistor, alone, could not perform this function.

Active signal combiner 500 is of a type which supplies an output current, to an internal load element (not shown), having a first component substantially equal to the magnitude of the output signal current produced by the converter 400 and a second component directly proportional to the magnitude of the output signal voltage of filter 400 and inversely proportional to the value of the aforementioned current gain ratio control resistor (not shown). The gain control resistor, as previously mentioned, is of a predetermined value and preferably is selected to provide a ratio of the first and second currents of 1:2 and is biased by source 600 to maintain essentially zero quiescent potential thereacross so that the combiner quiescent power dissipation is independent of the value of the gain "ratio" control resistor. The combination of the 2:1 gain ratio for the frequency selective and non-frequency selective signal paths (i.e., 301 and 400) with the choice of a damping factor of about 1.7 for filter 301 has been found to provide an essentially constant delay with frequency up to about 0.4 fo where fo is the filter center frequency.

Figure 2:
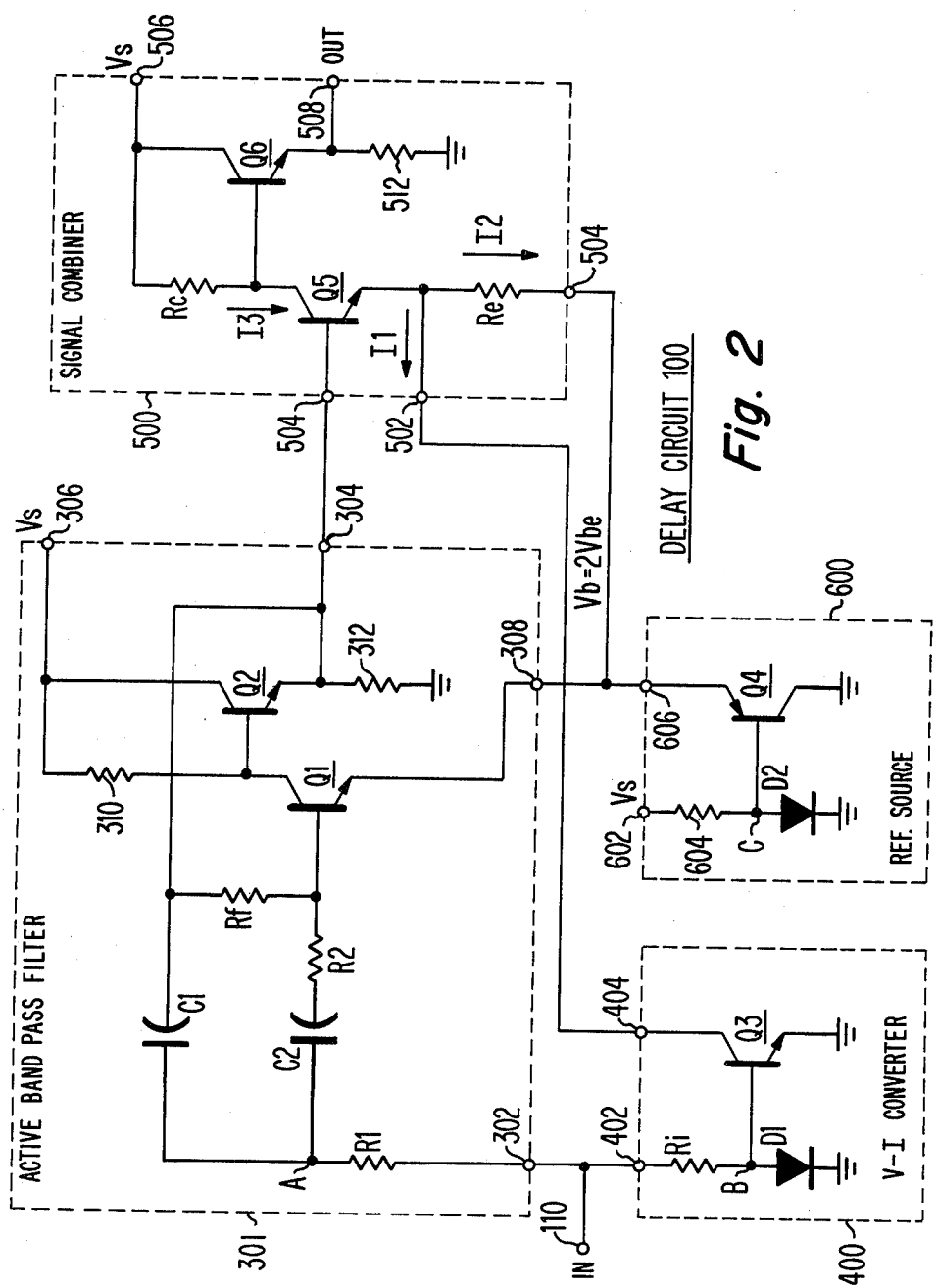
FIG. 2 is a schematic diagram of the delay circuit of FIG. 1.

Further details of construction and operation of the delay circuit 100 will now be considered with reference to FIG. 2. Filter 301 comprises an input terminal 302 connected to input terminal 110 of the delay circuit for receiving the luminance input signal, an output terminal 304 for providing a bandpass filtered, inverted and delayed output signal, a supply terminal 306 for receiving a source of supply voltage, Vs, and a bias voltage input terminal 308 for receiving a bias voltage, Vb, provided by source 600. The bias voltage, as will be explained, determines the DC component of the output signal at terminal 304.

Terminal 308 applies the bias voltage Vb to the emitter electrode of an inverting amplifier comprising a common emitter stage (transistor Q1 and collector load resistor 310) connected in cascade with a common collector stage (transistor Q2 and its emitter load resistor 312). Since the amplifier input (base, Q1) is A.C. coupled to terminal 302 via a frequency selective network (R1,C1,R2,C2) and its output terminal 304 is coupled via a negative feedback path (feedback resistor Rf) to the base of Q1, the D.C. component of the filter 301 output voltage will equal the sum of the bias voltage Vb plus the base-emitter voltage drop, Vbe, of transistor Q1. In this example, the source 600 regulates Vb at a value of 2 Vbe so that the quiescent DC output voltage at terminal 304 of the filter 301 is equal to 3 Vbe. The AC gain within the filter passband is determined by the value of Rf and the impedance of the frequency selective network (R1,C1,R2,C2).

The frequency selective network in filter 301 comprises a first resistor R1 and a first capacitor C1 connected in series, in that order, between terminals 302 and 304 with the common connection (node A) of the series RC elements coupled to the base of transistor Q1 via a series connection of a second capacitor C2 and resistor R2 to the base of transistor Q1. This network structure is similar to a second order minimum capacitance Sallen and Key active bandpass filter except that a low input impedance amplifier is used for the active element rather than a high input impedance amplifier. Use of a low input impedance amplifier minimizes effects of parasitic input capacitance for the amplifier so that the filter characteristics are essentially determined only by R1,C1,R2,C2, and Rf. This has been found to minimize the effects of the parasitic input capacitance of the amplifier (a low input impedance results because of the negative feedback produced by resistor Rf). Preferably, the two capacitors C1 and C2 are equal valued and, when constructed in integrated circuit form, are MOS capacitors formed proximate to each other on the semiconductor die. This minimizes fringing effect differences, temperature and voltage sensitivity and results in more uniform overall response characteristics. Specific design equations for the values of R1,C1,R2,C2 are given, for example, in the previously mentioned Sallen and Key article. Suitable values for the filter elements for the example of FIG. 1, where a 5 MHz operating range and 100 nSecond delay is desired, are: R1=2740 Ohms, R2=600 Ohms, C1=C2=5 pF, Rf=9000 Ohms, R310=5100 Ohms and R312=56000 Ohms.

Converter 400 comprises a conventional ground referenced current mirror amplifier (diode D1, transistor Q3) having an input (node B) coupled to the converter input terminal 402 via a current limiting resistor Ri. The collector of transistor Q3 is connected to the converter output terminal 404 thereby providing current to the current input terminal 502 of combiner 500 equal to the input voltage at delay circuit input terminal 110 times the transconductance of converter 400. The transconductance of converter 400 is a function of the value of the input resistor Ri and the junction area ratio between diode D1 and the base-emitter junction of NPN transistor Q3 (i.e., the current gain of the current mirror amplifier D1, Q3). To a first approximation one may neglect the offset voltage of the mirror at node B and calculate the transconductance or V-I conversion factor (i.e., output current vs input voltage) by multiplying the mirror current gain by the derivative of the current flow through resistor Ri with respect to the voltage at terminal 402. An illustrative value for Ri is 2740 Ohms for a mirror gain of unity in this example of the invention. Improved mirror gain stability may be achieved by coupling the emitter of transistor Q3 and the cathode of diode D1 to ground via respective equal valued resistors (not shown). An illustrative value for such gain stabilizing resistors is 510 Ohms.

Reference voltage source 600, in this example of the invention, provides two functions. First, it supplies bias voltage (2 Vbe) to filter 301 and combiner 500 which is greater than the saturation voltage level of the current mirror amplifier (D1, Q3) in voltage-to-current converter 400. The operating voltage for transistor Q3 is determined by the voltage at terminal 502 of combiner 500 which, in turn is 1 Vbe less than that at terminal 304 of filter 300 and thus equals 2 Vbe. This voltage, 2 Vbe, is greater than the saturation level of transistor Q3 (about 1 Vbe for this form of current mirror amplifier) so that transistor Q3 cannot saturate whereby the collector current I1 of Q3 is always linearly related to the input voltage at terminal 110. In applications where the current mirror amplifier (D1, Q3) is referenced to a negative potential rather than ground, source 600 may be omitted and terminals 308 and 504 grounded. The second function of source 600, in this example of the invention, is to provide maintenance of terminals 308 and 504 at equal potentials. As will be explained, this assures that no quiescent current can flow through the current gain ratio control resistor Re in combiner 500, thus preventing quiescent power dissipation in resistor Re which reduces the overall power dissipation of the delay circuit 100. This is desirable in that it facilitates construction of many delay circuits on one semiconductor die since resistor Re does not dissipate any power under quiescent signal conditions.

Source 600 comprises an input terminal 602 for receiving a source of supply voltage Vs. Terminal 602 is coupled to ground via a current limiting resistor 604 and a diode D2. A potential of 1 Vbe is produced at the common connection of diode D2 and resistor 604 (node C). Node C is connected to the base of a common collector connected PNP regulator transistor Q4, the emitter of which is connected to output terminal 606 and thus regulates the output voltage (Vb) at terminals 308 and 504 at a value equal to the sum of the voltage produced across diode D2 and the threshold voltage of transistor Q4, namely, 2 Vbe. The value of resistor 604 is not critical but preferably is relatively high (18000 Ohms, for example) to minimize the delay circuit power dissipation.

Signal combiner 500 provides a number of functions, such as: conversion of the voltage produced by filter 301 to a current, I2; summation of the current I1 produced by converter 400 with the current I2 to form a composite output current I3; controlling the ratio of the components of I3; conversion of the current I3 to an output voltage; and providing high to low output impedance conversion. The combiner comprises an NPN transistor Q5 connected at the base electrode thereof to input terminal 504 for receiving the output voltage of filter 301. The base input impedance of transistor Q5 is relatively high so substantially no load is presented to the output of filter 301. The collector and emitter electrodes of transistor Q5 are coupled via respective collector and emitter resistors, Rc and Re, to a supply voltage input terminal 506 and the bias or reference voltage input terminal 504. The emitter of Q5 is connected directly to the current input terminal 502 of the combiner for receiving the current I1 from converter 400. The current I1 provides the sole source of quiescent operating current for transistor Q5 since the quiescent voltage across resistor Re is always zero. This results because the DC or quiescent output voltage of filter 301 equals 3 Vbe, the base emitter voltage drop across Q5 equals 1 Vbe so that the quiescent emitter voltage of Q5 equals 2 Vbe which is the same as the voltage applied to terminal 504 by source 600.

The current I2, although zero in the quiescent state, is directly proportional under dynamic signal conditions to the output voltage of filter 301 and inversely proportional to the value of resistor Re. Thus, resistor Re controls the ratio of the currents I1 and I2. I1 is proportional to the luminance signal in the non-frequency selective path including converter 400 and I2 is proportional to the luminance signal in the frequency selective path including filter 301. For maximum phase linearity, this ratio I2/I1 should be 2:1.

The currents I1 and I2 are summed at the emitter of transistor Q5 to form a resultant output current I3 which is converted to an output voltage by means of collector resistor Rc. Since the output impedance at the collector of transistor Q5 is, to a first approximation, equal to the value of resistor Rc (a relatively high valued resistor) the impedance is reduced by means of an emitter follower transistor Q6 which supplies the output signal to output terminal 508. The collector of transistor Q6 is connected to terminal 506 and its emitter is coupled to ground via a load resistor 512. This emitter follower prevents any loading on terminal 508 from changing the gain of the signal combiner. Resistor Rc controls the overall gain of the delay circuit and may be selected to provide a gain or a loss but preferably (for purposes of cascading delay line sections) is selected to provide an overall delay circuit gain of unity. Illustrative values for Rc and Re are 3700 Ohms and 2000 Ohms, respectively. A convenient design aid is that the delay circuit gain through the non-frequency selective path (400, 500) equals Rc/Ri and that through the frequency selective path (301, 600) is KRc/Re, where K is the gain of filter 301.

Figure 3:
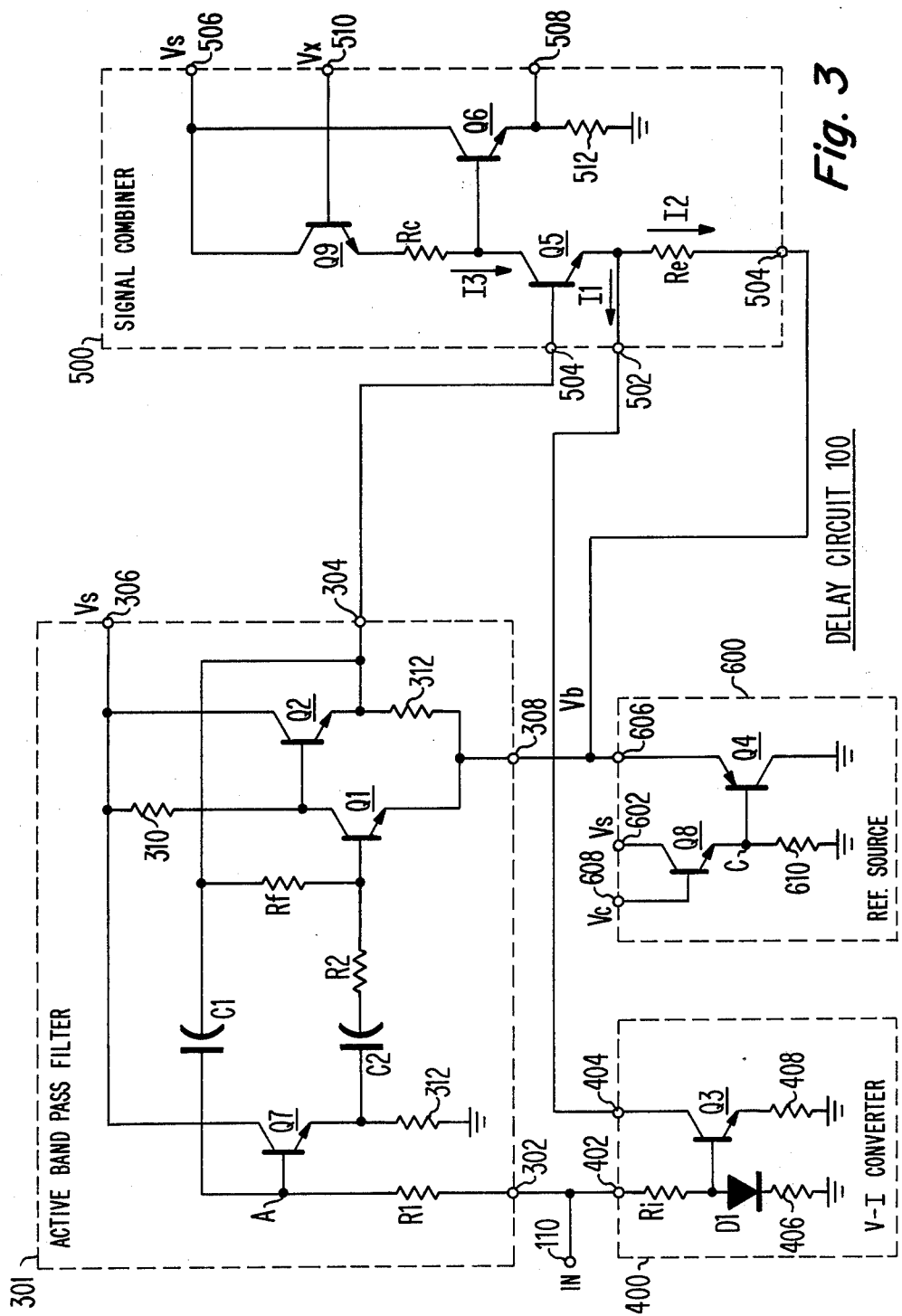
FIG. 3 is a schematic diagram illustrating certain modifications of the delay circuit of FIG. 2.

FIG. 3 illustrates several desirable modifications of the delay circuit 100 of FIG. 1. In filter 301, for example, capacitors C1 and C2 have been isolated by means of a buffer amplifier comprising an emitter follower transistor Q7 connected at the base and collector electrodes to node A and terminal 306, respectively. The emitter of transistor Q7 is coupled to ground via a load resistor 312 and to capacitor C1. This change decreases the sensitivity of the filter to component value changes. Illustrative values (for a delay of about 100 nSeconds) are C1=C2=5 pF; R1=3200 Ohms, R2=2900 Ohms, and RF=4800 Ohms.

Voltage-to-current converter 400 has been modified to include resistors 406 and 408 in the connections between diode D1 and transistor Q3 and ground. This change improves the linearity of the current mirror amplifier and thus of the overall voltage-to-current converter. Illustrative values for the added resistors are 500 Ohms each. An illustrative value for resistor Ri.

Reference voltage source 600 has been modified by replacing resistor 604 with an emitter follower transistor Q8 having a collector electrode connected to supply terminal 602, a base electrode connected to a control voltage input terminal 608 for receiving a control voltage Vc and an emitter electrode connected to node "C" which is coupled to ground via a load resistor 610 rather than a diode. This is an advantage in applications where several delay circuits are cascaded in that the bias voltage Vb for all stages may be controlled by a single source of the control voltage Vc so that only one control voltage regulator (e.g., a Zener diode) is needed.

Signal combiner 500 has been modified to include an emitter follower transistor Q9 connected at the collector electrode thereof to supply terminal 506 for receiving the supply voltage Vs, at the emitter electrode thereof to resistor Rc and at the base electrode thereof to an input terminal 510 for receiving a DC level control voltage Vx. Two advantages of this change are: (1) transistor Q9 decouples resistor Rc from the main supply voltage source Vs, thereby minimizing the tendency for feedback through the supply line and (2) the DC level of the output signal at terminal 508 may be adjusted to any desired level by adjustment of the control voltage Vx. This simplifies cascading of several delay circuits. Suitable values for resistors Rc and Re, in this example, are 2500 Ohms and 850 Ohms, respectively.

Numerous changes may be made to the examples of the invention shown and described herein. The transistor types may be replaced with complementary transistors with appropriate reversal of the supply voltage polarities. Bipolar transistors may be replaced with field effect transistors. Reference voltage source 600 may be omitted as previously noted. Other changes and applications of the invention will be readily apparent to one of skill in the art.

What is claimed is:

1. In a delay circuit of the type comprising an input node for receiving an input signal to be delayed, active bandpass filter means having an input coupled to said node and an output for providing a bandpass filtered output signal voltage, voltage-to-current converter means having an input coupled to said node and an output for providing an output signal current proportional to the amplitude of said input signal and independent of the frequency thereof, and active signal combining means responsive to said signal voltage and to said signal current for providing a delayed output signal, the improvement for minimizing quiescent power dissipation of said delay circuit, characterized in that:

said filter means includes first transistor means biased to regulate a DC component of said output signal voltage at a predetermined value equal to the sum of a DC reference voltage supplied to said first transistor means and a threshold voltage characteristic of said first transistor means;

said combiner means includes second transistor means having a threshold voltage substantially equal to that of said first transistor means, having a control electrode coupled to receive said signal voltage, having a conduction path coupled at a first end thereof to a source of supply voltage via a load resistor for developing said delayed signal and coupled at a second end thereof to receive said signal current, said signal current including a DC component providing the sole source of quiescent operating current for said second transistor means; and a resistor in said combiner means coupled between said second end of said conduction path of said second transistor means and a source of said DC reference voltage for maintaining a substantially zero quiescent power dissipation in said resistor means, said resistor means controlling the ratio of components of said delayed signal attributable to said signal current and to said signal voltage.

2. A delay circuit as recited in claim 1 further characterized in that said voltage-to-current converter means comprises current mirror amplifier means having a linear operating range for values of operating potential applied to the output terminal thereof greater than a minimum value and wherein said DC reference voltage supplied to said filter means and to said resistor in said combiner means is greater than said minimum value.

3. A delay circuit as recited in claim 1 wherein said active bandpass filter means is of the second order and is of a type having a frequency selective network including two substantially equal valued capacitors.

4. A delay circuit as recited in claim 3 wherein said frequency selective network in said active bandpass filter means includes circuit elements selected to provide a filter damping factor substantially equal to 1.6.

5. A delay circuit as recited in claim 3 wherein said active bandpass filter means further comprises buffer amplifier means for providing isolation between said two substantially equal valued capacitors.

6. A delay circuit as recited in claim 1, wherein said resistor is selected such that said ratio of said components of said delayed signal is substantially equal to 2:1.

7. A delay circuit as recited in claim 1 wherein said active signal combining means further comprises further circuit means responsive to a control signal supplied thereto for controlling the DC voltage level of said output signal voltage in accordance with said control signal.

* * * * *